(12) United States Patent
Gunnam (10) Patent No.: US 8,464,128 B2
(45) Date of Patent: Jun. 11, 2013

(54) BREAKING UNKNOWN TRAPPING SETS USING A DATABASE OF KNOWN TRAPPING SETS

(75) Inventor: Kiran Gunnam, San Jose, CA (US)

(73) Assignee: LSI Corporation, San Jose, CA (US)

( * ) Notice: Subject to any disclaimer, the term of this patent is extended or adjusted under 35 U.S.C. 154(b) by 671 days.

(21) Appl. No.: 12/540,002

(22) Filed: Aug. 12, 2009

(65) Prior Publication Data

US 2010/0042904 A1    Feb. 18, 2010

Related U.S. Application Data

(60) Provisional application No. 61/089,297, filed on Aug. 15, 2008.

(51) Int. Cl.
*G06F 11/00* (2006.01)
(52) U.S. Cl.
USPC .......................... 714/759; 714/752; 714/780
(58) Field of Classification Search
None
See application file for complete search history.

(56) References Cited

U.S. PATENT DOCUMENTS

| | | |
|---|---|---|
| 3,755,779 A | 8/1973 | Price |
| 4,295,218 A | 10/1981 | Tanner |
| 5,048,060 A | 9/1991 | Arai et al. |
| 5,721,745 A | 2/1998 | Hladik et al. |
| 5,734,962 A | 3/1998 | Hladik et al. |
| 6,023,783 A | 2/2000 | Divsalar et al. |
| 6,236,686 B1 | 5/2001 | Kamishima |
| 6,307,901 B1 | 10/2001 | Yu et al. |
| 6,550,023 B1 | 4/2003 | Brauch et al. |
| 6,678,843 B2 | 1/2004 | Giulietti et al. |
| 6,745,157 B1 | 6/2004 | Weiss et al. |

(Continued)

FOREIGN PATENT DOCUMENTS

| | | |
|---|---|---|
| JP | 2007036495 A | 11/2007 |
| JP | 2009100222 A | 5/2009 |

(Continued)

OTHER PUBLICATIONS

K. Gunnam et al., "Value-Reuse Properties of Min-Sum for GF(q)" (dated Oct. 2006) Dept. of ECE, Texas A&M University Technical Note, published about Aug. 2010.

(Continued)

*Primary Examiner* — Scott Baderman
*Assistant Examiner* — Jason Bryan
(74) *Attorney, Agent, or Firm* — Mendelsohn, Drucker & Associates, P.C.; Craig M. Brown; Steve Mendelsohn (57) ABSTRACT

In one embodiment, an LDPC decoder attempts to recover an originally-encoded LDPC codeword based on a set of channel soft-output values. If the decoder observes a trapping set, then the decoder compares the observed trapping set to known trapping sets stored in a trapping-set database to determine whether or not the observed trapping set is a known trapping set. If the observed trapping set is not known, then the decoder selects a most-dominant trapping set from the trapping-set database and identifies the locations of erroneous bit nodes in the selected trapping set. Then, the decoder adjusts the channel soft-output values corresponding to the identified erroneous bit nodes. Adjustment is performed by inverting some or all of the hard-decision bits of the corresponding channel soft-output values and setting the confidence value of each corresponding channel soft-output value to maximum. Decoding is then restarted using the adjusted channel soft-output values.

20 Claims, 3 Drawing Sheets

U.S. PATENT DOCUMENTS

| | | |
|---|---|---|
| 6,760,879 B2 | 7/2004 | Giese et al. |
| 6,888,897 B1 | 5/2005 | Nazari et al. |
| 6,910,000 B1 | 6/2005 | Yedidia et al. |
| 7,143,333 B2 | 11/2006 | Blankenship et al. |
| 7,181,676 B2 | 2/2007 | Hocevar |
| 7,219,288 B2 | 5/2007 | Dielissen et al. |
| 7,237,181 B2 | 6/2007 | Richardson |
| 7,296,216 B2 | 11/2007 | Shen et al. |
| 7,340,671 B2 | 3/2008 | Jones et al. |
| 7,353,444 B2 | 4/2008 | Owsley et al. |
| 7,457,367 B2 | 11/2008 | Farhang-Boroujeny et al. |
| 7,689,888 B2 | 3/2010 | Kan et al. |
| 7,725,800 B2 | 5/2010 | Yang et al. |
| 7,730,377 B2 | 6/2010 | Hocevar |
| 7,739,558 B1 * | 6/2010 | Farjadrad et al. ............. 714/704 |
| 7,752,523 B1 | 7/2010 | Chaichanavong et al. |
| 7,770,090 B1 | 8/2010 | Kons et al. |
| 7,805,642 B1 | 9/2010 | Farjadrad |
| 7,895,500 B2 | 2/2011 | Sun et al. |
| 7,904,793 B2 | 3/2011 | Mokhlesi et al. |
| 7,941,737 B2 | 5/2011 | Gopalakrishnan et al. |
| 7,949,927 B2 | 5/2011 | Park et al. |
| 8,010,869 B2 | 8/2011 | Wejn et al. |
| 8,020,070 B2 | 9/2011 | Langner et al. |
| 8,037,394 B2 | 10/2011 | Djurdjevic et al. |
| 8,046,658 B2 | 10/2011 | Heinrich et al. |
| 8,051,363 B1 | 11/2011 | Liu |
| 8,103,931 B2 | 1/2012 | Wang et al. |
| 8,127,209 B1 * | 2/2012 | Zhang et al. ................. 714/780 |
| 8,151,171 B2 | 4/2012 | Blanksby |
| 8,156,409 B2 | 4/2012 | Patapoutian et al. |
| 8,161,345 B2 | 4/2012 | Graef |
| 8,171,367 B2 | 5/2012 | Gao et al. |
| 8,205,134 B2 | 6/2012 | Harrison et al. |
| 8,205,144 B1 | 6/2012 | Yadav |
| 8,214,719 B1 | 7/2012 | Sheng et al. |
| 8,219,878 B1 | 7/2012 | Varnica et al. |
| 8,255,763 B1 | 8/2012 | Yang et al. |
| 8,301,984 B1 | 10/2012 | Zhang et al. |
| 2002/0062468 A1 | 5/2002 | Nagase et al. |
| 2002/0166095 A1 | 11/2002 | Lavi et al. |
| 2005/0132260 A1 | 6/2005 | Kyung et al. |
| 2005/0193320 A1 | 9/2005 | Varnica et al. |
| 2005/0204255 A1 | 9/2005 | Yeh et al. |
| 2005/0283707 A1 | 12/2005 | Sharon et al. |
| 2006/0013306 A1 | 1/2006 | Kim et al. |
| 2006/0036928 A1 | 2/2006 | Eroz et al. |
| 2006/0107181 A1 | 5/2006 | Dave et al. |
| 2006/0115802 A1 | 6/2006 | Reynolds |
| 2006/0285852 A1 | 12/2006 | Xi et al. |
| 2007/0011569 A1 | 1/2007 | Vila Casado et al. |
| 2007/0011573 A1 | 1/2007 | Farjadrad et al. |
| 2007/0011586 A1 | 1/2007 | Belogolovyi et al. |
| 2007/0044006 A1 | 2/2007 | Yang et al. |
| 2007/0071009 A1 | 3/2007 | Nagaraj et al. |
| 2007/0089018 A1 | 4/2007 | Tang et al. |
| 2007/0089019 A1 | 4/2007 | Tang et al. |
| 2007/0124652 A1 | 5/2007 | Litsyn et al. |
| 2007/0147481 A1 | 6/2007 | Bottomley et al. |
| 2007/0153943 A1 | 7/2007 | Nissila |
| 2007/0162788 A1 | 7/2007 | Moelker |
| 2007/0220408 A1 | 9/2007 | Huggett et al. |
| 2007/0234178 A1 | 10/2007 | Richardson et al. |
| 2007/0234184 A1 | 10/2007 | Richardson |
| 2008/0049869 A1 | 2/2008 | Heinrich et al. |
| 2008/0082868 A1 | 4/2008 | Tran et al. |
| 2008/0104485 A1 | 5/2008 | Lyakh et al. |
| 2008/0109701 A1 | 5/2008 | Yu et al. |
| 2008/0126910 A1 | 5/2008 | Venkatesan et al. |
| 2008/0148129 A1 | 6/2008 | Moon |
| 2008/0163032 A1 | 7/2008 | Lastras-Montano |
| 2008/0235561 A1 | 9/2008 | Yang |
| 2008/0276156 A1 | 11/2008 | Gunnam et al. |
| 2008/0301517 A1 | 12/2008 | Zhong |
| 2008/0301521 A1 | 12/2008 | Gunnam et al. |
| 2009/0063931 A1 | 3/2009 | Rovini et al. |
| 2009/0083609 A1 | 3/2009 | Yue et al. |
| 2009/0132897 A1 | 5/2009 | Xu et al. |
| 2009/0150745 A1 * | 6/2009 | Langner et al. ............... 714/752 |
| 2009/0235146 A1 | 9/2009 | Tan et al. |
| 2009/0259912 A1 | 10/2009 | Djordjevic et al. |
| 2009/0273492 A1 | 11/2009 | Yang et al. |
| 2009/0307566 A1 | 12/2009 | No et al. |
| 2009/0319860 A1 * | 12/2009 | Sharon et al. ................. 714/752 |
| 2010/0037121 A1 | 2/2010 | Jin et al. |
| 2010/0042806 A1 | 2/2010 | Gunnam |
| 2010/0042890 A1 | 2/2010 | Gunnam |
| 2010/0050043 A1 | 2/2010 | Savin |
| 2010/0058152 A1 | 3/2010 | Harada |
| 2010/0088575 A1 | 4/2010 | Sharon et al. |
| 2010/0192043 A1 | 7/2010 | Alrod et al. |
| 2011/0041029 A1 | 2/2011 | Yedidia et al. |
| 2012/0135285 A1 | 5/2012 | Iwama et al. |
| 2012/0139074 A1 | 6/2012 | Abe |

FOREIGN PATENT DOCUMENTS

| | | |
|---|---|---|
| WO | WO03092170 A1 | 11/2003 |
| WO | WO2004079563 A1 | 9/2004 |
| WO | WO2007114724 A1 | 10/2007 |
| WO | WO2008004215 A2 | 1/2008 |
| WO | WO 2010/019168 A1 | 2/2010 |

OTHER PUBLICATIONS

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Sripimanwat, K., "Turbo Code Applications: A Journey From A Paper to Realization", Oct. 26, 2005, Springer, p. 27.

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Richardson, Tom, "Error Floors of LDPC Codes," Allerton Conf. on Communication, Control and Computing, (Monticello, Illinois), Oct. 2003, pp. 1426-1435.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. 15.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block—LDPC: A Practical LDPC Coding System Design Approach", IEEE transactions on circuits and systems-I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 6398-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,pp. 1-4.

Kiran K. Gunnam, Gwan S. Choi and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. MacKay—"Information Theory, Inference, and Learning Algorithms", Cambridge University Press Sep. 2003, p. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, In Coding, Cryptography and Combinatorics",Computer Science and Applied Logic, Birkhauser, Basel, 2004, pp. 85-110, vol. 23.

Yang Hand and William E. Ryan—"LDPC Decoder Strategies for Achieving Low Error Floors", Proceedings of Informatiuon Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002 , ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,p. 90.

T. Richardson and R. Urbanke—"Modern Coding Theory", Cambridge University Press, Preliminary version—Oct. 18, 2007, p. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.

D.J.C. MacKay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transaction on Information Theory, Sep. 1981, pp. 533-547,vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.

Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

Tuchler, M., et al., "Improved Receivers for Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, Oct. 7, 2002; pp. 99-104; XP002966498.

Alghonaim, E., et al., "Improving BER Performance of LDPC codes Based on Intermediate Decoding Results," Signal Processing and Communications; 2007; ICSPC, 2007; IEEE International Conference; IEEE; Piscataway, NJ; USA; Nov. 24, 2007; pp. 1547-1550; XP031380831.

Pusane, A.E.; Costello, D.J.; Mitchell, D.G.M;, "Trapping Set Analysis of Protograph-Based LDPC Convolutional Codes," Information Theory, 2009. ISIT 2009. IEEE International Symposium on, vol., No., pp. 561-565, Jun. 28, 2009-Jul. 3, 2009.

Laendner, S.; Milenkovic, O.;, "LDPC Codes Based on Latin Squares: Cycle Structure, Stopping Set, and Trapping Set Analysis," Communications, IEEE Transactions on, vol. 55, No. 2, pp. 303-312, Feb. 2007.

Dehkordi, M.K,; Banihashemi, A.H.;, "An Efficient Algorithm for Finding Dominant Trapping Sets of LDPC Codes," Turbo Codes and Iterative Information Processing (ISTC), 2010 6th International Symposium on, pp. 444-448, Sep. 6-10, 2010.

C. A. Cole, S. G. Wilson, E. K. Hall and T. R. Giallorenzi, "A General Method for Finding Low Error Rates of LDPC Codes," http://arxiv.org/abs/cs.IT/0605051.

D. MacKay and M. Postol, "Weaknesses of margulis and ramanujan-margulis low-density parity-check codes," Electronic Notes in Theoretical Computer Science, vol. 74, 2003.

B. Xia and W. E. Ryan, "On importance sampling for linear block codes," Proc. 2003 IEEE International Conference on Communications, vol. 4, pp. 2904-2908, May 2003.

L. Dolecek, Z. Zhang, M. Wainwright, V. Anantharam, and B. Nikoli'c, "Evaluation of the low frame error rate performance of LDPC codes using importance sampling," 2007 IEEE Inform. Theory Workshop, Sep. 2-6, 2007.

Casado, V., et al., "Informed Dynamic Scheduling for Belief-Propagation Decoding of LDPC Codes," IEEE International Conference on Communications, Jun. 24-28, 2007, pp. 932-937.

Presman, N., et al., "Efficient Layers-based Schedules for Iterative Decoding of LDPC Codes," IEEE International Symposium on Information Theory, Jul. 6-11, 2008, pp. 1148-1152.

Radosavljevic, P., et al., "Optimized Message Passing Schedules for LDPC Decoding," Conference Record of the Thirty-Ninth Asilomar conference on Signals, Systems and Computers, Oct. 28, 2005-Nov. 1, 2005, pp. 591-595.

Zheng, H., et al., "MMSE-Based Design of Scaled and Offset BP-Based Decoding Algorithms on the Fast Rayleigh Fading Channel," IEEE International Symposium on Circuits and Systems, May 24, 2006, pp. 2061-2064.

Sakai, R., et al., "Reduced Complexity Decoding Based on Approximation of Update Function for Low-Density Parity-Check Codes," Transactions of the Institute of Electronics, Information and Communication Engineers, Feb. 1, 2007, vol. J90-A, No. 2, pp. 83-91.

* cited by examiner $$H = \begin{pmatrix} B_{1,1} & B_{1,2} & B_{1,3} & B_{1,4} & B_{1,5} & B_{1,6} & B_{1,7} & B_{1,8} & B_{1,9} & B_{1,10} \\ B_{2,1} & B_{2,2} & B_{2,3} & B_{2,4} & B_{2,5} & B_{2,6} & B_{2,7} & B_{2,8} & B_{2,9} & B_{2,10} \\ B_{3,1} & B_{3,2} & B_{3,3} & B_{3,4} & B_{3,5} & B_{3,6} & B_{3,7} & B_{3,8} & B_{3,9} & B_{3,10} \\ B_{4,1} & B_{4,2} & B_{4,3} & B_{4,4} & B_{4,5} & B_{4,6} & B_{4,7} & B_{4,8} & B_{4,9} & B_{4,10} \end{pmatrix} \begin{matrix} \} r = 4 \end{matrix}$$

$\underbrace{\phantom{XXXXXXXXXXXXXXXXXXXXX}}_{c = 10}$

FIG. 3

BREAKING UNKNOWN TRAPPING SETS USING A DATABASE OF KNOWN TRAPPING SETS

CROSS-REFERENCE TO RELATED APPLICATIONS

This application claims the benefit of the filing date of U.S. provisional application No. 61/089,297, filed on Aug. 15, 2008, the teachings of which are incorporated herein by reference in their entirety.

The subject matter of this application is related to U.S. patent application Ser. No. 12/113,729 filed May 1, 2008, U.S. patent application Ser. No. 12/113,755 filed May 1, 2008, U.S. patent application Ser. No. 12/323,626 filed Nov. 26, 2008, U.S. patent application Ser. No. 12/401,116 filed Mar. 10, 2009, PCT patent application no. PCT/US08/86523 filed Dec. 12, 2008, PCT patent application no. PCT/US08/86537 filed Dec. 12, 2008, PCT patent application no. PCT/US09/39918 filed Apr. 8, 2009, PCT application no. PCT/US09/39279 filed on Apr. 2, 2009, U.S. patent application Ser. No. 12/420,535 filed Apr. 8, 2009, U.S. patent application Ser. No. 12/475,786 filed Jun. 1, 2009, U.S. patent application Ser. No. 12/260,608 filed on Oct. 29, 2008, PCT patent application no. PCT/US09/41215 filed on Apr. 21, 2009, U.S. patent application Ser. No. 12/427/786 filed on Apr. 22, 2009, U.S. patent application Ser. No. 12/492,328 filed on Jun. 26, 2009, U.S. patent application Ser. No. 12/492,346 filed on Jun. 26, 2009, U.S. patent application Ser. No. 12/492,357 filed on Jun. 26, 2009, U.S. patent application Ser. No. 12/492,374 filed on Jun. 26, 2009, and U.S. patent application Ser. No. 12/538,915 filed on Aug. 11, 2009, the teachings of all of which are incorporated herein by reference in their entirety.

BACKGROUND OF THE INVENTION

1. Field of the Invention

The present invention relates to signal processing, and, in particular, to error-correction encoding and decoding techniques such as low-density parity-check (LDPC) encoding and decoding.

2. Description of the Related Art

In attempting to recover a correct low-density parity-check (LDPC)-encoded codeword, an LDPC decoder may encounter one or more trapping sets that prevent the decoder from properly decoding the codeword. Trapping sets, which represent subgraphs in a Tanner graph of an LDPC code, typically have a strong influence on error-floor characteristics of the LDPC code because a trapping set may force the decoder to converge to an incorrect result. To improve error-floor characteristics, an LDPC decoder may employ different techniques to, for example, (i) break the trapping sets and/or (ii) prevent the LDPC decoder from converging on trapping sets.

SUMMARY OF THE INVENTION

In one embodiment, the present invention is an apparatus for recovering an error-correction (EC)-encoded codeword. The apparatus comprises an EC decoder and a controller. The EC decoder performs EC decoding to attempt to recover the EC-encoded codeword from a set of channel soft-output values. The controller determines, if the EC decoder converges on an observed trapping set, whether or not the observed trapping set corresponds to a known trapping set stored in a database of known trapping sets. If the controller determines that the observed trapping set does not correspond to a known trapping set, then the controller selects one or more known trapping sets from the database. The apparatus then adjusts the set of channel soft-output values based on the one or more known trapping sets to generate a set of adjusted channel soft-output values for subsequent EC decoding.

In another embodiment, the present invention is a method for recovering an error-correction (EC)-encoded codeword. In particular, EC decoding is performed to attempt to recover the EC-encoded codeword from a set of channel soft-output values. If the EC decoding converges on an observed trapping set, then the method determines whether or not the observed trapping set corresponds to a known trapping set stored in a database of known trapping sets. If the observed trapping set does not correspond to a known trapping set, then the method selects one or more known trapping sets from the database, and adjusts the set of channel soft-output values based on the one or more known trapping sets to generate a set of adjusted channel soft-output values for subsequent EC decoding.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Figure 1:
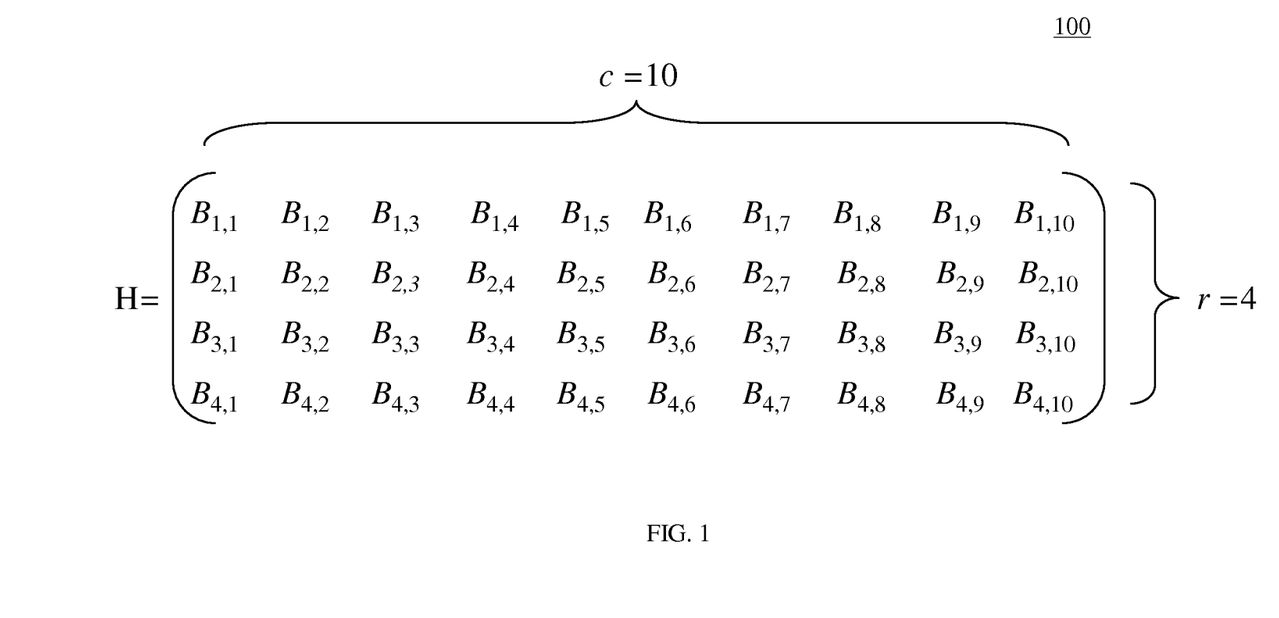
FIG. 1 shows one implementation of a parity-check matrix that may be used to implement a regular, quasi-cyclic (QC) low-density parity-check (LDPC) code.

FIG. 1 shows one implementation of a parity-check matrix 100 that may be used to implement a regular, quasi-cyclic (QC) LDPC code. Parity-check matrix 100, commonly referred to as an H-matrix, comprises 40 circulants $B_{j,k}$ that are arranged in r=4 rows of circulants (i.e., block rows) where j=1, . . . , r and c=10 columns of circulants (i.e., block columns) where k=1, . . . , c. A circulant is a sub-matrix that is either an identity matrix or is obtained by cyclically shifting an identity matrix, and a quasi-cyclic LDPC code is an LDPC code in which all of the sub-matrices are circulants. In H-matrix 100, each circulant $B_{j,k}$ is a p×p sub-matrix that may be obtained by cyclically shifting a single p×p identity matrix. For purposes of this discussion, assume that p=72 such that H-matrix 100 has p×r=72×4=288 total rows and p×c=72×10=720 total columns. Since each circulant $B_{j,k}$ is a permutation of an identity matrix, the hamming weight (i.e., the number of entries having a value of one) of each column in a circulant and the hamming weight of each row in a circulant are both equal to 1. Thus, the total hamming weight $w_r$ for each row of H-matrix 100 is equal to 1×c=1×10=10, and the total hamming weight $w_c$ for each column of H-matrix 100 is equal to 1×r=1×4=4. Each of the 288 rows of H-matrix 100 corresponds to an $m^{th}$ check node, where m ranges from 0, . . . , 287, and each of the 720 columns corresponds to an $n^{th}$ variable node (also referred to as a bit node), where n ranges from 0, . . . , 719. Further, each check node is connected to $w_r$=10 variable nodes as indicated by the 1s in a row, and each variable node is connected to $w_c$=4 check nodes as indicated by the 1s in a column. H-matrix 100 may be described as a regular LDPC code since all rows of H-matrix 100 have the same hamming weight $w_r$ and all columns of H-matrix 100 have the same hamming weight $w_c$.

Figure 2:
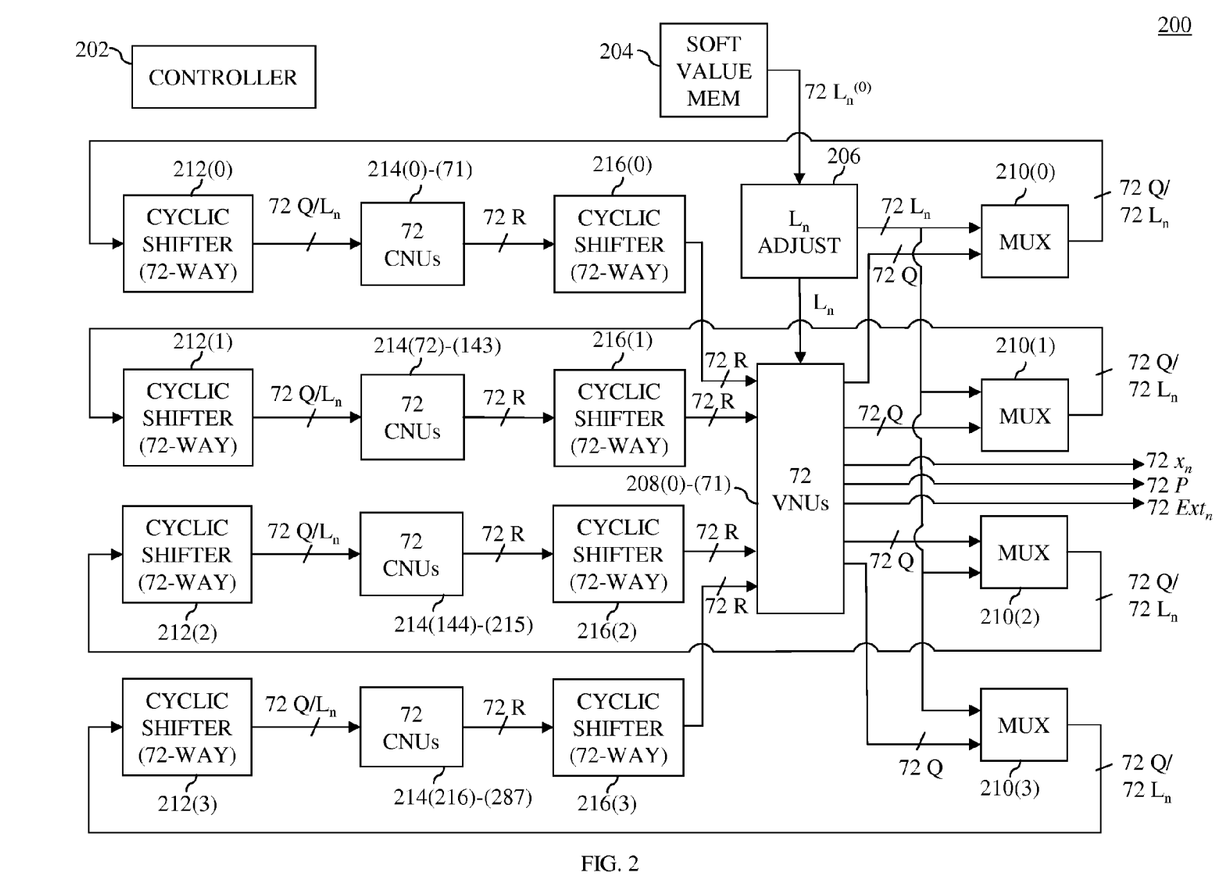
FIG. 2 shows a simplified block diagram of an LDPC decoder according to one embodiment of the present invention that may be used to decode codewords encoded using an H-matrix such as the H-matrix of FIG. 1.

FIG. 2 shows a simplified block diagram of an LDPC decoder 200 according to one embodiment of the present invention that may be used to decode codewords encoded using an H-matrix such as H-matrix 100 of FIG. 1. For each codeword received, LDPC decoder 200 receives 720 channel soft-output values (e.g., log-likelihood ratios (LLR)) $L_n^{(0)}$ from a channel detector such as a soft-output Viterbi detector and stores these channel soft-output values $L_n^{(0)}$ in soft-value memory 204. Each channel soft-output value $L_n^{(0)}$ corresponds to one bit of the codeword, and each codeword is decoded iteratively using a message-passing algorithm. The term "soft-output value" refers to a value having a hard-decision bit (i.e., the most-significant bit) and one or more confidence-value bits (i.e., the least significant bits).

In general, LDPC decoder 200 decodes the 720 channel soft-output values $L_n^{(0)}$ (i.e., messages) using a block-serial message-passing schedule. The messages are updated using (i) 288 check-node units (CNUs) 214, where each CNU 214 performs check-node updates for one row (i.e., the $m^{th}$ check node) of H-matrix 100 and (ii) 72 variable-node units (VNUs) 208, where each VNU 208 performs the variable-node updates for ten columns (i.e., the $n^{th}$ variable nodes) of H-matrix 100. CNUs 214(0)-(287) perform the check-node (i.e., row) updates for the 288 rows of H-matrix 100, one block column at a time, such that the check-node updates for the first block column (i.e., circulants $B_{1,1}$, $B_{2,1}$, $B_{3,1}$, and $B_{4,1}$) are performed, followed by the check-node updates for the second block column (i.e., circulants $B_{1,2}$, $B_{2,2}$, $B_{3,2}$, and $B_{4,2}$), followed by the check-node updates for the third block column (i.e., circulants $B_{1,3}$, $B_{2,3}$, $B_{3,3}$, and $B_{4,3}$), and so forth. VNUs 208(0)-(71) then perform the variable-node (i.e., column) updates for the 720 columns of H-matrix 100, one block column at a time, such that the variable-node updates for the first block column (i.e., circulants $B_{1,1}$, $B_{2,1}$, $B_{3,1}$, and $B_{4,1}$) are performed, followed by the variable-node updates for the second block column (i.e., circulants $B_{1,2}$, $B_{2,2}$, $B_{3,2}$, and $B_{4,2}$), followed by the variable-node updates for the third block column (i.e., circulants $B_{1,3}$, $B_{2,3}$, $B_{3,3}$, and $B_{4,3}$), and so forth. A local iteration of LDPC decoder 200 is complete after all check-node updates and variable-node updates have been performed (i.e., one pass through LDPC decoder 200 has been performed). The term "local iteration" refers to one iteration internal to the LDPC decoder itself.

During the initial iteration, 720 channel soft-output values $L_n^{(0)}$ are provided to four multiplexers 210(0)-(3) via adjustment block 206. During the initial iteration, adjustment block 206 typically does not adjust the channel soft-output values $L_n^{(0)}$. Rather, adjustment is preferably performed during subsequent iterations, if needed, as described below. The 720 channel soft-output values $L_n^{(0)}$ are provided to multiplexers 210(0)-(3) at a rate of 72 channel soft-output values $L_n^{(0)}$ per clock cycle such that each multiplexer 210 receives all 72 channel soft-output values $L_n^{(0)}$ in the set. Each multiplexer 210 also receives 72 variable-node messages (herein referred to as Q messages) that are generated as discussed in further detail below from VNUs 208(0)-(71). During the first iteration of LDPC decoder 200, multiplexers 210(0)-(3) select the sets of 72 channel soft-output values $L_n^{(0)}$ that they receive to output to 72-way cyclic shifters 212(0)-(3), respectively. The initial Q messages, which are not selected, may be Q messages generated for a previously considered codeword. During subsequent iterations of LDPC decoder 200, multiplexers 210(0)-(3) select the sets of 72 Q messages that they receive from VNUs 208(0)-(71) to output to 72-way cyclic shifters 212(0)-(3), respectively. For the following discussion, it will be understood that any reference to Q messages applies to channel soft-output values $L_n^{(0)}$ during the first iteration of LDPC decoder 200.

Cyclic shifters 212(0)-(3) cyclically shift the sets of 72 Q messages that they receive based on a cyclic-shift signal that may be received from, for example, controller 202. Controller 202 may be implemented as an integral component to LDPC decoder 200 or may be implemented as a component that is separate from LDPC decoder 200. The cyclic-shift signal corresponds to cyclic-shift factors of the circulants of H-matrix 100 of FIG. 1. For example, during the first clock cycle of an iteration of LDPC decoder 200, cyclic shifters 212(0)-(3) may shift their respective sets of 72 Q messages based on the shift factors of circulants $B_{1,1}$, $B_{2,1}$, $B_{3,1}$, and $B_{4,1}$ of H-matrix 100 of FIG. 1, respectively. During the second clock cycle of an iteration of LDPC decoder 200, cyclic shifters 212(0)-(3) may shift their respective sets of 72 Q messages based on the shift factors of circulants $B_{1,2}$, $B_{2,2}$, $B_{3,2}$, and $B_{4,2}$, respectively. Cyclic shifters 212(0)-(3) then provide their respective 72 cyclically shifted Q messages to CNUs 214(0)-(287), such that each CNU 214 receives a different one of the Q messages.

Each CNU 214 (i) receives a number of Q messages equal to the hamming weight $w_r$ of a row of H-matrix 100 (e.g., 10) at a rate of one Q message per clock cycle and (ii) generates $w_r$ check-node messages (herein referred to as R messages). Each R message may be generated using a suitable check-node algorithm, such as the offset min-sum algorithm, characterized by Equations (1), (2), and (3) shown below:

$$R_{mn}^{(i)} = \delta_{mn}^{(i)} \max(\kappa_{mn}^{(i)} - \beta, 0) \tag{1}$$

$$\kappa_{mn}^{(i)} = |R_{mn}^{(i)}| = \min_{n' \in N(m)/n} |Q_{n'm}^{(i-1)}| \tag{2}$$

$$\delta_{mn}^{(i)} = \left( \prod_{n' \in N(m)/n} \text{sign}(Q_{n'm}^{(i-1)}) \right), \tag{3}$$

where (i) $R_{mn}^{(i)}$ represents the R message corresponding to $m^{th}$ check node (i.e., row) and the $n^{th}$ variable node (i.e., column) of H-matrix 100 of FIG. 1 for the $i^{th}$ iteration of LDPC decoder 200, (ii) $Q_{nm}^{(i-1)}$ represents the Q message corresponding to the $n^{th}$ variable node and the $m^{th}$ check node of H-matrix 100 for the $(i-1)^{th}$ iteration, (iii) $\beta$ represents an offset value that varies with code parameters, and (iv) the function sign indicates that the multiplication operation (i.e., Π) is performed on the signs of the $Q_{nm}^{(i-1)}$ messages. Suppose that n' is a variable node in the set N(m)/n of all variable nodes connected to the $m^{th}$ check node except for the $n^{th}$ variable node (i.e., n'∈N(m)/n). The CNU 214 corresponding to the $m^{th}$ check node (i.e., row) generates message $R_{mn}^{(i)}$ based on all Q messages received during the previous $(i-1)^{th}$ iteration from the set N(m)/n. Thus, in the embodiment of FIG. 2, each R message is generated based on N(m)/n=nine Q messages (i.e., $w_r$−1=10−1). Note that, for the first iteration, channel soft-output values $L_n^{(0)}$ received from soft-value memory 204 are used in Equations (2) and (3) in lieu of the Q messages for the prior iteration (i.e., $Q_{n'm}^{(0)}=L_{n'm}^{(0)}$).

Cyclic shifters 216(0)-(3) receive sets of 72 R messages from their respective CNUs 214 and cyclically shift the sets of 72 R messages according to the cyclic shifts of the circulants $B_{j,k}$ of H-matrix 100 of FIG. 1. Essentially, cyclic shifters 216(0)-(3) reverse the cyclic shifting of cyclic shifters 212(0)-(3). For example, if cyclic shifters 212(0)-(3) perform cyclic upshifting, then cyclic shifters 216(0)-(3) may perform cyclic downshifting.

Cyclic shifters 216(0)-(3) provide 4×72 cyclically shifted R messages to VNUs 208(0)-(71), such that each VNU 208 receives four of the R messages, one from each cyclic shifter 216. Each VNU 208 updates each of the four Q messages that it generates as shown in Equation (4):

$$Q_{nm}^{(i)} = L_n^{(0)} + \sum_{m' \in M(n)/m} R_{m'n}^{(i-1)}, \quad (4)$$

where m' is a check node in the set M(n)/m of all check nodes connected to the $n^{th}$ variable node except the $m^{th}$ check node (i.e., m'∈M(n)/m). The $n^{th}$ variable node generates message $Q_{nm}^{(i)}$ based on (i) all R messages received during the previous $(i-1)^{th}$ iteration from the set M(n)/m and (ii) an initial channel soft-output value $L_n^{(0)}$ received from soft-output value memory 204 via adjustment block 206 that corresponds to the $n^{th}$ variable node. Each VNU 208, which may be implemented using adder circuits, outputs the four updated Q messages that it generates, such that a different one of the four messages is provided to a different corresponding MUX 210.

In addition to outputting four updated Q messages, each VNU 208 outputs (i) a seven-bit extrinsic LLR value, (ii) a hard-decision output bit, and (iii) an eight-bit P value. Each seven-bit extrinsic LLR value may be represented as shown in Equation (5):

$$\text{Extrinsic Value}_n = \sum_{m \in M(n)} R_{mn}^{(i)}, \quad (5)$$

where m is a check node in the set M(n) of all check nodes connected to the $n^{th}$ variable node (i.e., m∈M(n)). Each eight-bit P value may be generated using Equation (6) as follows:

$$P_n = L_n^{(0)} + \sum_{m \in M(n)} R_{mn}^{(i)}, \text{ and} \quad (6)$$

each hard-decision bit $\hat{x}_n$ may be generated based on Equations (7) and (8) below:

$$\hat{x}_n = 0 \text{ if } P_n \geq 0 \quad (7)$$

$$\hat{x}_n = 1 \text{ if } P_n < 0. \quad (8)$$

$P_n$ is determined for each variable node by adding the extrinsic value from Equation (5) to the initial channel soft-output value $L_n^{(0)}$ received from soft-value memory 204 via adjustment block 206 that corresponds to the $n^{th}$ variable node. If $P_n$ is greater than or equal to zero, then the hard-decision bit $\hat{x}_n$ is equal to zero, as shown in Equation (7). If $P_n$ is less than zero, then the hard-decision bit $\hat{x}_n$ is equal to one, as shown in Equation (8).

A parity check is then performed by, for example, a syndrome check calculator (not shown), using the hard-decision bits $\hat{x}_n$ to determine whether LDPC decoder 200 has possibly converged on a valid codeword. The syndrome check calculator may be implemented as part of controller 202 or as a separate logic circuit. In particular, a 720-element vector $\hat{x}$ formed from 720 hard-decision bits $\hat{x}_n$ output from VNUs 208(0)-(71) during ten clock cycles is multiplied by the transpose $H^T$ of H-matrix 100 of FIG. 1 (assuming binary summation) to generate a 288-bit vector (i.e., syndrome), where each bit of the 288-bit syndrome corresponds to one of the 288 check nodes (i.e., rows) of H-matrix 100. If one or more elements of the resulting 288-bit syndrome is equal to one (i.e., $\hat{x}H^T \neq 0$), then LDPC decoder 200 has not converged on a valid codeword. Each element of the 288-bit syndrome that has a value of one corresponds to an unsatisfied check node, and each element of the 288-bit syndrome that has a value of zero indicates either (i) a satisfied check node or (ii) a missatisfied check node (i.e., a check node that falsely shows as satisfied).

If each element of the resulting 288-bit vector is equal to zero (i.e., $\hat{x}H^T=0$), then LDPC decoder 200 has converged on a valid codeword and a cyclic-redundancy check (CRC) may be performed by, for example, controller 202 to determine whether the valid codeword is the correct codeword (i.e., the codeword that was transmitted). When CRC is part of the encoding scheme, typically a number r of CRC bits are appended to the user data at the transmitter before LDPC encoding such that, upon decoding, the 720-element vector $\hat{x}$ output from VNUs 208(0)-(71) comprises (i) the user data transmitted by the transmitter and (ii) the r CRC bits. To perform the CRC, the user data may be divided by a keyword that is known a priori by the receiver and the remainder of the division process may be compared to the r CRC bits. If the remainder is equal to the r CRC bits, then LDPC decoder 200 has converged on the correct codeword. If the remainder is not equal to the r CRC bits, then LDPC decoder 200 has converged on a valid codeword that is not the correct codeword (i.e., the valid codeword has one or more missatisfied check nodes). In this case, further actions may be taken to recover the correct codeword, such as a re-read of the data.

If, after a predetermined number of iterations, LDPC decoder 200 does not converge on a valid codeword, then controller 202 may (i) determine the number of unsatisfied check nodes and (ii) compare the number of unsatisfied check nodes to a specified threshold value (e.g., 16). The specified threshold value, which may be determined experimentally, may be used to predict whether LDPC decoder 200 has (i) converged on a trapping set or (ii) experienced an error in the communication channel that does not correspond to convergence on a trapping set. If the number of unsatisfied check nodes is greater than or equal to the specified threshold value, then it is likely that LDPC decoder 200 has experienced an error in the communication channel. Such errors may result from, for example, a flaw on the platter of a hard-disk drive or excessive noise in the communication channel. When such errors occur, further action, such as retransmission of the data, may be needed to recover the correct codeword. In some cases, LDPC decoder 200 might not be capable of recovering the correct codeword.

If, after the predetermined number of local iterations, the number of unsatisfied check nodes is less than the specified threshold value, then it is likely that LDPC decoder 200 has converged on a trapping set. A trapping set may be caused by the passing of incorrect information between the check nodes and variable nodes. Further, a trapping set may be defined as a set of w variable nodes that converges on a syndrome having a set of v odd-degree check nodes (i.e., unsatisfied check nodes) and an arbitrary number of even-degree check nodes (i.e., satisfied and/or missatisfied check nodes).

When LDPC decoder 200 arrives at a trapping set (i.e., an observed trapping set) a number of different methods may be used to break the observed trapping set. For example, in one method known as list decoding, the observed trapping set is matched against a database of known trapping sets that stores one or more trapping sets that the decoder has previously encountered. Typically, for each stored trapping set (i.e., each known trapping set), the database stores (i) the number of unsatisfied check nodes corresponding to the trapping set, (ii) the distances between the unsatisfied check nodes of the known trapping set, and (iii) the indices of one or more erroneous bit nodes associated with those unsatisfied check nodes. To perform list decoding, the observed trapping set is compared to the known trapping sets in the database until either (i) an isomorphic match is found or (ii) it is determined that none of the known trapping sets match the observed trapping set. An isomorphic match exists when (i) the number of unsatisfied check nodes of a known trapping set is the same as that of the observed trapping set and (ii) the distances between the unsatisfied check nodes of the known trapping set are the same as that of the observed trapping set. Thus, if the observed unsatisfied check nodes are [1,3,10], then [1,3, 10] is a match, [2,4,11] is an isomorphic match, [3,5,12] is an isomorphic match, and so forth.

If a known trapping set is found in the database that matches the observed trapping set, then the erroneous bit node index value(s) are retrieved from the trapping-set database. Then, the channel soft-output values $L_n$ corresponding to the erroneous bit node index value(s) are adjusted by, for example, adjustment block 206, and decoder 200 is restarted using the adjusted channel soft-output values $L_n$. Assuming sign-magnitude format is used, adjustment of the channel soft-output values $L_n$ may be performed by (i) inverting the hard-decision value of the channel soft-output value $L_n$ (i.e., 1 becomes 0 and vice versa) and (ii) setting the confidence value of the channel soft-output values $L_n$ whose hard-decision bits are inverted to maximum (e.g., all ones). Note that, if the channel soft-output values $L_n$ are represented in two's-complement format, then (i) all confidence bits corresponding to an inverted hard-decision bit that is positive are set to one and (ii) all confidence bits corresponding to an inverted hard-decision bit that is negative are set to zero. Often, adjusting one or two channel soft-output values $L_n$ will be sufficient to break the trapping set, and the re-started decoder will converge on the correct codeword. More detailed discussions of list-decoding methods are provided in PCT application no. PCT/US08/86523 and PCT application no. PCT/US08/86537.

In some cases, an observed trapping set might not be known by the decoder (i.e., not stored in the database), and thus, other methods may be needed to break the trapping set. When the observed trapping set is unknown, controller 202 may select one or more trapping sets from the trapping-set database. Preferably, controller 202 selects one or two dominant trapping sets from the trapping-set database based on dominance. Dominance is determined with respect to the effects of a trapping set on bit-error rate (BER)/error-floor characteristics. For example, the most-dominant trapping sets are those trapping sets that, when broken, yield the largest improvement in BER/error-floor characteristics. Note that, in most cases, the one or more trapping sets selected will not correspond to the observed trapping set. Further, the same one or more trapping sets selected may be used anytime that the decoder arrives at an unknown trapping set, and therefore, it might not be necessary to search the trapping-set database every time that the decoder arrives at an unknown trapping set.

After selecting the one or more trapping sets from the trapping-set database, the indices (locations) of the erroneous bit nodes in the one or more trapping sets are identified. Then, adjustment block 206 selects the channel soft-output values $L_n^{(0)}$ corresponding to the erroneous-bit-node locations of the one or more selected trapping sets. For example, suppose that one trapping set is selected from the trapping-set database and that the selected trapping set has four erroneous bit nodes. The four erroneous bit nodes correspond to four channel soft-output values $L_n^{(0)}$ (i.e., one channel soft-output value $L_n^{(0)}$ per erroneous bit node). Further, the four hard-decision bits of the channel soft-output values $L_n^{(0)}$, when considered together, may have any one of sixteen (e.g., $2^4$) different possible-bit arrangements (e.g., 1111, 1110, 1101, 1011, 0111, 1100, 1001, 0011, 1010, 0101, 0110, 1000, 0100, 0010, 0001, 0000).

Controller 202 selects a different one of the sixteen possible bit arrangements, and adjustment block 206 adjusts the set of channel soft-output values $L_n^{(0)}$ by flipping one or more of the hard-decision bits corresponding to the four selected channel soft-output values $L_n^{(0)}$ to match the selected bit arrangement. Note that, as used in this specification and the following claims, adjusting even just one soft-output value in a set of soft-output values implies that the set has been adjusted. Suppose that, in the example above, the hard-decision bits of the four channel soft-output values $L_n^{(0)}$ have an arrangement of 1011. Controller 202 may select any of the other fifteen bit arrangements, such as 0101. As illustrated by this example, some or all of the hard-decision bits of the corresponding four channel soft-output values $L_n^{(0)}$ may be inverted. To limit the number of different possible bit arrangements, the one or more trapping sets selected from the trapping-set database may be constrained to a maximum number of specified erroneous bit nodes (e.g., 4).

In addition to selecting one of the possible bit arrangements, adjustment block 206 increases the confidence-value bits of all four of the selected channel soft-output values $L_n^{(0)}$ (preferably to maximum) in a manner similar that described above in relation to the list-decoding method. LDPC decoder 200 is restarted using the adjusted channel soft-output values $L_n$ rather than the original, unmodified channel soft-output values $L_n^{(0)}$. If, upon restarting, LDPC decoder 200 converges on a valid codeword, then a CRC may be performed as described above, and if LDPC decoder 200 arrives at a known trapping set, then the known trapping set may be corrected as described above.

As another example of adjusting, suppose that controller 202 selects two trapping sets, where (i) each of the trapping sets has two erroneous bit nodes and (ii) the two trapping sets have one erroneous bit node in common. In this case, the two trapping sets together have a total of three different erroneous bit nodes because one erroneous bit node is common to both sets. The three different erroneous bit nodes may have any one of eight (e.g., $2^3$) different possible bit arrangements (e.g., 111, 110, 101, 011, 100, 001, 010, 000), and the channel soft-output values $L_n^{(0)}$ may be adjusted to match any of the remaining seven bit arrangements.

If LDPC decoder 200 does not break the unknown trapping set or arrives at another unknown trapping set, then (i) a different one of the sixteen bit arrangements is selected, (ii) adjustment block 206 adjusts the channel soft-output values $L_n^{(0)}$ based on the new bit arrangement, and (iii) LDPC decoder 200 is restarted using the newly adjusted channel soft-output values $L_n$. This process may be repeated until either the decoder converges or all of the sixteen bit arrangements have been attempted.

Figure 3:
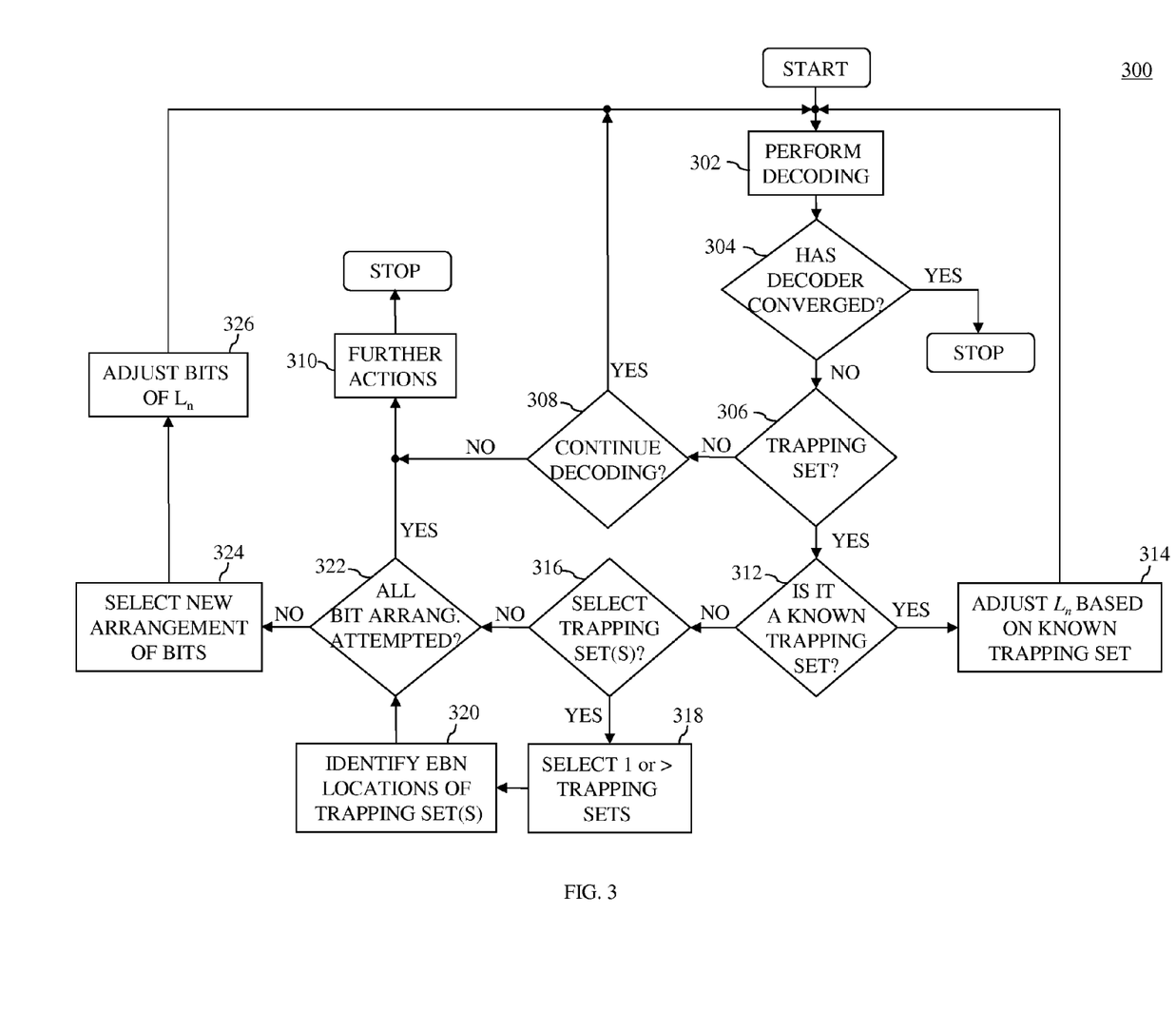
FIG. 3 shows a simplified flow diagram of processing performed by an error-correction decoder such as the LDPC decoder of FIG. 2.

FIG. 3 shows a simplified flow diagram 300 of processing performed by an error-correction decoder such as LDPC decoder 200 of FIG. 2. Upon startup, the error-correction decoder performs decoding using the original, unmodified channel soft-output values $L_n^{(0)}$ (step 302). The controller then performs decision 304 to determine whether the decoder has converged on a valid codeword by, for example, performing a syndrome check as described above. If the decoder has converged on a valid codeword, then the decoder stops decoding. If the decoder has not converged on a valid codeword, then the controller determines whether a trapping set has been encountered (decision 306).

Determining whether the decoder has encountered a trapping may be performed using any suitable method. For example, as described above, the controller may compare the number of unsatisfied check nodes after a specified number of iterations of the decoder to a specified threshold value. If the number of unsatisfied check nodes is greater than or equal to the specified threshold value, then it is likely that the error-correction decoder has experienced an error in the communication channel. If the number of unsatisfied check nodes is less than the specified threshold value, then it is likely that the error-correction decoder has converged on a trapping set. As another example, the decoder could track the number of unsatisfied check nodes over several iterations. If, over several iterations, the number of unsatisfied check nodes is relatively stable, then this could be indicative of a trapping set. This method may be implemented by tracking the variance of the number of unsatisfied check nodes over several iterations. If the variance is less than a specified threshold value, then the LDPC decoder may suppose that a trapping set has been encountered. This later example may be advantageous when the decoder converges on a trapping set before the specified number of iterations. By identifying a trapping set before the specified number of iterations, the decoder can avoid performing unnecessary iterations.

As yet another example, the decoder could determine whether (i) the vector resulting from $\hat{x}H^T$ possesses a number ($b_{observed}$) of unsatisfied check nodes that is greater than zero and less than a pre-defined threshold $b_{max}$ (e.g., 16) and (ii) the particular configuration of unsatisfied check nodes has remained relatively stable (i.e., the number and locations of the unsatisfied check nodes have not changed) for several local iterations of the LDPC decoder (e.g., two or three local iterations). As yet still another example, the decoder could determine whether (i) the vector resulting from $\hat{x}H^T$ possesses a number ($b_{observed}$) of unsatisfied check nodes greater than zero and less than a pre-defined threshold $b_{max}$ (e.g., 16), and (ii) the particular configuration of unsatisfied check nodes has remained relatively stable (i.e., unchanged) for several global iterations (e.g., two global iterations). A global iteration is an iteration that includes LDPC decoding and channel detection.

If the controller determines in decision 306 that the decoder has not converged on a trapping set, then the decoder may determine whether or not to continue decoding (decision 308). For example, if the number of unsatisfied check nodes is relatively large (e.g., greater than 16), then, as described above, the decoder might have experienced an error in the communication channel. In such a case, it might not be possible for the decoder to recover the correct codeword, and the controller might initiate further actions (step 310) such as request a retransmission of the data. If the decoder determines in decision 308 to continue decoding (i.e., perform an additional local iteration), then processing returns to step 302 for more decoding.

If the controller determines in decision 306 that the decoder has converged on a trapping set, then the controller determines whether the observed trapping set is a known trapping set (decision 312) by comparing the observed trapping set to known trapping sets stored in a trapping-set database as described above. If the observed trapping set is a known trapping set, then the channel soft-output values $L_n$ corresponding to the erroneous bit node index value(s) are adjusted (step 314) as described above and decoding is restarted 302 using the adjusted channel soft-output values $L_n$. If the observed trapping set is not a known trapping set (i.e., is an unknown trapping set), then the controller determines (step 316) whether or not to select one or more trapping sets from the database of known trapping sets based on whether or not one or more trapping sets were selected during a previous iteration for the current codeword.

If the one or more trapping sets were not selected during a previous iteration for the current codeword (step 316), then one or more known trapping sets are selected (step 318) from the trapping-set database as described above, and the locations of the erroneous bit nodes (EBN) of the selected trapping set(s) are identified (step 320). If the one or more trapping sets were selected during a previous iteration for the current codeword (step 316), then the one or more trapping sets previously selected may be used. After selecting the one or more trapping sets, or if a trapping set has already been selected, the controller determines (decision 322) whether or not all bit arrangements for the channel soft-output values $L_n^{(0)}$ have been attempted. If all bit arrangements have not yet been attempted, then (i) the controller selects (step 324) a new bit arrangement for the channel soft-output values $L_n^{(0)}$, (ii) an adjustment block such as adjustment block 206 of FIG. 2 adjusts (step 326) the channel soft-output values $L_n^{(0)}$ (e.g., both the hard-decision bits and the confidence-value bits) based on the newly selected arrangement of bits as described above, and (iii) decoding is performed (step 302) using the adjusted channel soft-output values $L_n$. If all bit arrangements have been attempted, then further actions 310, such as retransmission of the data, may be needed to recover the correct error-correction encoded codeword.

If, after converging on an unknown trapping set, the error-correction decoder breaks the unknown trapping set and converges on a valid codeword, then the controller may store the unknown trapping set in the trapping-set database as a new known trapping set. Various methods for storing trapping sets in trapping-set databases are discussed in PCT/US08/86523.

Although embodiments of the present invention have been described in the context of LDPC codes, the present invention is not so limited. Embodiments of the present invention could be implemented for other codes that can be defined by a graph, e.g., tornado codes and structured IRA codes, since graph-defined codes suffer from trapping sets.

Further, although the present invention has been described relative to the specific non-layered LDPC decoder configuration 200 of FIG. 2, the present invention is not so limited. Various embodiments of the present invention may also be envisioned for other LDPC decoder structures that employ message passing. For example, the present invention may be implemented for other non-layered or for layered decoder structures, and decoders that use message-passing schedules other than a block-serial message-passing schedule. A few exemplary layered decoders are presented in U.S. patent application Ser. No. 12/113,729 filed May 1, 2008, the teachings all of which are incorporated herein by reference in their entirety.

According to various embodiments, the present invention may be implemented using check-node algorithms other than the offset min-sum algorithm. For example, such embodiments may use a scaled min-sum algorithm, or any soft-input/soft-output algorithms other than the min-sum algorithm, such as a sum-product algorithm (SPA) or the Bahl-Cocke-Jelinek-Raviv (BCJR) algorithm.

Although the present invention was described relative to the specific H-matrix 100 of FIG. 1, the present invention is not so limited. The present invention may be implemented for various H-matrices that are suitable for message-passing decoding and that are the same size as or a different size from matrix 100 of FIG. 1. For example, the present invention may be implemented for H-matrices in which the number of columns, block columns, rows, block rows, layers (including implementations having only one layer), messages processed per clock cycle, the size of the sub-matrices, the size of the layers, and/or the column and/or row hamming weights differ from that of H-matrix 100. Such H-matrices may be, for example, cyclic, quasi-cyclic, non-cyclic, regular, or irregular H-matrices. H-matrices that are non-cyclic do not have any sub-matrices that are obtained by cyclically shifting an identity matrix. H-matrices that are irregular do not have the same hamming weight $w_r$ for all rows and/or the same hamming weight $w_c$ for all columns. Further, such H-matrices may comprise sub-matrices other than circulants including zero matrices. Note that the number of VNUs, barrel shifters, and/or CNUs may vary according to the characteristics of the H-matrix.

It will be further understood that various changes in the details, materials, and arrangements of the parts which have been described and illustrated in order to explain the nature of this invention may be made by those skilled in the art without departing from the scope of the invention as expressed in the following claims.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

I claim:

1. An apparatus for recovering an error-correction encoded codeword, the apparatus comprising:
    an error-correction decoder that performs error-correction decoding to attempt to recover the error-correction-encoded codeword from a set of channel soft-output values; and
    a controller that:
        determines, if the error-correction decoder converges on an observed trapping set, whether or not the observed trapping set corresponds to any known trapping set stored in a database of known trapping sets; and
        selects, if the controller determines that the observed trapping set does not correspond to any known trapping set, one or more known trapping sets from the database, wherein:
    the apparatus adjusts the set of channel soft-output values based on the one or more known trapping sets to generate a set of adjusted channel soft-output values for subsequent error-correction decoding.

2. The invention of claim 1, wherein:
    for each known trapping set, the database stores (i) a number of unsatisfied check nodes corresponding to the known trapping set and (ii) distances between the unsatisfied check nodes corresponding to the known trapping set; and
    the controller determines whether or not the observed trapping set corresponds to a known trapping set by comparing (i) a number of unsatisfied check nodes corresponding to the observed trapping set to the number of unsatisfied check nodes corresponding to the known trapping set and (ii) distances between the unsatisfied check nodes corresponding to the observed trapping set to the distances between the unsatisfied check nodes corresponding to the known trapping set.

3. The invention of claim 1, wherein the controller selects the one or more known trapping sets from the database based on dominance of the known trapping sets in the database.

4. The invention of claim 3, wherein the controller selects the one or more known trapping sets such that the one or more known trapping sets are the most-dominant trapping sets stored in the database.

5. The invention of claim 3, wherein dominance of the one or more known trapping sets is determined based on the effects of a known trapping set on bit-error rate.

6. The invention of claim 1, wherein:
for each known trapping set, the database stores indices of one or more erroneous bit nodes corresponding to the known trapping set; and
the controller selects for adjustment a selected subset of one or more channel soft-output values in the set of channel soft-output values such that the selected subset corresponds to the one or more erroneous bits nodes.

7. The invention of claim 6, wherein:
the controller selects two or more known trapping sets from the database; and
the selected subset of one or more channel soft-output values corresponds to erroneous bit nodes in the two or more known trapping sets.

8. The invention of claim 6, wherein the adjuster adjusts the set of channel soft-output values by flipping hard-decision bits of one or more of the channel soft-output values in the selected subset of one or more channel soft-output values.

9. The invention of claim 8, wherein, for each channel soft-output value in the selected subset, the adjuster increases a confidence value corresponding to the channel soft-output value.

10. The invention of claim 8, wherein, if subsequent error-correction decoding results in convergence on an observed trapping set that does not correspond to a known trapping set, then the apparatus attempts to recover the correct error-correction-encoded codeword by flipping a different arrangement of hard-decision bits in the selected subset.

11. The invention of claim 6, wherein, if subsequent error-correction decoding results in convergence on the error-correction-encoded codeword, then the apparatus stores the unknown trapping set in the trapping set database as a new known trapping set.

12. The invention of claim 1, wherein the error-correction decoder is a low-density parity-check decoder.

13. A method for recovering an error-correction encoded codeword, the method comprising:
(a) performing error-correction decoding to attempt to recover the error-correction-encoded codeword from a set of channel soft-output values;
(b) determining, if the error-correction decoding converges on an observed trapping set, whether or not the observed trapping set corresponds to any known trapping set stored in a database of known trapping sets;
(c) selecting, if the observed trapping set does not correspond to any known trapping set, one or more known trapping sets from the database; and
(d) adjusting the set of channel soft-output values based on the one or more known trapping sets to generate a set of adjusted channel soft-output values for subsequent error-correction decoding.

14. The invention of claim 13, wherein:
for each known trapping set, the database stores (i) a number of unsatisfied check nodes corresponding to the known trapping set and (ii) distances between the unsatisfied check nodes corresponding to the known trapping set; and
step (b) determines whether or not the observed trapping set corresponds to a known trapping set by comparing (i) a number of unsatisfied check nodes corresponding to the observed trapping set to the number of unsatisfied check nodes corresponding to the known trapping set and (ii) distances between the unsatisfied check nodes corresponding to the observed trapping set to the distances between the unsatisfied check nodes corresponding to the known trapping set.

15. The invention of claim 13, wherein step (c) comprises selecting the one or more known trapping sets from the database based on dominance of the known trapping sets in the database.

16. The invention of claim 15, wherein dominance of the one or more known trapping sets is determined based on the effects of a known trapping set on bit-error rate.

17. The invention of claim 13, wherein:
for each known trapping set, the database stores indices of one or more erroneous bit nodes corresponding to the known trapping set;
step (d) comprises selecting for adjustment a selected subset of one or more channel soft-output values in the set of channel soft-output values such that the selected subset corresponds to the one or more erroneous bits nodes.

18. The invention of claim 17, wherein the step (d) further comprises adjusting the set of channel soft-output values by flipping hard-decision bits of one or more of the channel soft-output values in the selected subset of one or more channel soft-output values.

19. The invention of claim 18, wherein step (d) further comprises, for each channel soft-output value in the selected subset, increasing a confidence value corresponding to the channel soft-output value.

20. The invention of claim 18, further comprising:
(e) attempting to recover the correct error-correction-encoded codeword by flipping a different arrangement of hard-decision bits in the selected subset, if subsequent error-correction decoding results in convergence on an observed trapping set that does not correspond to a known trapping set.

* * * * *